(12) United States Patent
Moore et al.

(10) Patent No.: US 12,249,642 B2
(45) Date of Patent: Mar. 11, 2025

(54) VERTICAL INSULATED GATE POWER SWITCH WITH ISOLATED BASE CONTACT REGIONS

(71) Applicant: Pakal Technologies, LLC, San Francisco, CA (US)

(72) Inventors: Paul M Moore, Hillsboro, OR (US); Richard A Blanchard, Los Altos Hills, CA (US); Vladimir Rodov, Seattle, WA (US)

(73) Assignee: Pakal Technologies, Inc., San Francisco, CA (US)

( * ) Notice: Subject to any disclaimer, the term of this patent is extended or adjusted under 35 U.S.C. 154(b) by 440 days.

(21) Appl. No.: 17/747,739

(22) Filed: May 18, 2022

(65) Prior Publication Data

US 2023/0032610 A1 Feb. 2, 2023

Related U.S. Application Data

(60) Provisional application No. 63/226,562, filed on Jul. 28, 2021.

(51) Int. Cl.
*H01L 29/745* (2006.01)
*H01L 29/06* (2006.01)
(Continued)

(52) U.S. Cl.
CPC ...... *H01L 29/7397* (2013.01); *H01L 29/7813* (2013.01)

(58) Field of Classification Search
CPC ............. H01L 29/0696; H01L 29/7397; H01L 29/7813; H01L 29/1095; H01L 29/7455;
(Continued)

(56) References Cited

U.S. PATENT DOCUMENTS 5,877,538 A 3/1999 Williams
6,265,735 B1 * 7/2001 Takahashi ........... H01L 29/7455
257/136

(Continued)

FOREIGN PATENT DOCUMENTS

JP 5554417 B2 6/2014
WO 2013049850 A1 4/2013
(Continued)

*Primary Examiner* — Kyoung Lee
*Assistant Examiner* — David J Goodwin
(74) *Attorney, Agent, or Firm* — Patent Law Group; Brian Ogonowsky

(57) ABSTRACT

In a vertical power device with trenched insulated gates, there is an npnp layered structure. The vertical gates turn on the device with a suitable gate bias to conduct a current between a top electrode and a bottom electrode. In an example, implanted n+ source regions are formed in the top surface within a p-well. Between some gates, the overlying dielectric is opened up, by etching, to expose distributed p-type contact regions for the p-well. The dielectric is also opened up to expose areas of the n+ source regions. The top electrode metal directly contacts the exposed p-type contact regions and the n+ source regions to provide distributed emitter-to-base short across the cellular array to improve device performance in the presence of transients. The p-contact regions are isolated from the n+ source regions, prior to the deposition of the metal electrode, due to the p-type contact regions not abutting the n+ source regions.

14 Claims, 10 Drawing Sheets

(51) Int. Cl.
*H01L 29/423* (2006.01)
*H01L 29/739* (2006.01)
*H01L 29/78* (2006.01)

(58) Field of Classification Search
CPC .......... H01L 29/66348; H01L 29/0619; H01L 29/4236
See application file for complete search history.

(56) References Cited

U.S. PATENT DOCUMENTS

| | | |
|---|---|---|
| 9,887,287 B1 | 2/2018 | Cree |
| 2015/0349104 A1* | 12/2015 | Rodov ................ H01L 29/0839 257/133 |
| 2018/0026121 A1* | 1/2018 | Blanchard ........... H01L 29/7813 257/140 |
| 2019/0067420 A1 | 2/2019 | Hidefumi |
| 2019/0259864 A1 | 2/2019 | Blanchard |
| 2019/0123192 A1 | 4/2019 | Hiromichi |
| 2020/0105873 A1 | 4/2020 | Blanchard |
| 2022/0052170 A1* | 2/2022 | Zeng .................. H01L 29/7813 |
| 2022/0344328 A1 | 10/2022 | Umeki |

FOREIGN PATENT DOCUMENTS

| | | |
|---|---|---|
| WO | 2018106325 A1 | 6/2018 |
| WO | 2021060085 A1 | 4/2021 |

* cited by examiner

VERTICAL INSULATED GATE POWER SWITCH WITH ISOLATED BASE CONTACT REGIONS

CROSS-REFERENCE TO RELATED APPLICATIONS

This application is based on U.S. provisional application Ser. No. 63/226,562, filed Jul. 28, 2021, by Paul M. Moore et al., assigned to the present assignee and incorporated herein by reference.

FIELD OF THE INVENTION

This invention relates to vertical, insulated gate power devices having gates (e.g., doped polysilicon) formed in etched trenches and, in particular, to a technique for improving device performance in the presence of transients by forming distributed p-type base contact regions electrically isolated from an n+ source region layer (acting as an emitter), and then shorting the p-type base contact regions to the n+ source region layer with a top metal electrode.

BACKGROUND

The invention deals with improvements in vertical insulated gate power devices, such as a stacked npnp device, where a relatively weak short is desired between the emitter and base of a vertical npn bipolar transistor to decrease the sensitivity of the power device to transients that may otherwise turn the device on. To put the invention in the context of an insulated gate power device, a particular power device will be described, followed by details of techniques to improve the performance of that device and related vertical power devices.

Prior art FIG. 1 is a cross-section of a small portion of an insulated gate power device 10 reproduced from the assignee's U.S. Pat. No. 8,878,237, incorporated herein by reference. The device 10 may be used as an on/off power switch. The portion is near an edge of the device and shows a plurality of cells having vertical gates 12 formed in insulated trenches. A 2-dimensional array of the cells may be formed in a common p-well 14, and the cells are connected in parallel. The p-well may be a tub or a layer, with both embodiments being referred to herein as a p-well layer.

The edge cell is modified to increase the ruggedness of the device. The edge cell has an opening 16 in the n+ source region 18 where the cathode electrode 20 shorts the n+ source region 18 to the p-well 14. This effectively weakly shorts the n-type emitter of a vertical npn bipolar transistor to its p-type base. Such shorting increases the tolerance to transients to prevent unwanted turn on and prevents the formation of hot spots. The configuration of the edge cell may also be used in other cells of the device for a more uniform performance across the device. As seen, the p-type region exposed by the opening 16 directly abuts the n+ source region 18 in the cell.

The present invention improves on the weak shorting of the emitter and base of the npn transistor.

Trenches are etched in the surface of the silicon wafer, and the sidewalls of the trench are oxidized to form an oxide layer 22. Doped polysilicon is deposited in the trenches using CVD to form vertical gates 12. The vertical gates 12 are insulated from the p-well 14 by the oxide layer 22. The narrow gates 12 (doped polysilicon) are connected together outside the plane of the drawing and are coupled to a gate voltage via the gate electrode 25 contacting the polysilicon portion 28.

A patterned dielectric layer 26 insulates the metal from the various regions. The guard rings 29 at the edge of the cell reduce field crowding for increasing the breakdown voltage.

An npnp semiconductor layered structure is formed. There is a bipolar pnp transistor formed by a p+ substrate 30, an n− epitaxial (epi) layer 32, and the p− well 14. There is also a bipolar npn transistor formed by the n-epi layer 32, the p-well 14, and the n+ source region 18. An n-type buffer layer 35, with a dopant concentration higher than that of the n− epi layer 32, reduces the injection of holes into the n− epi layer 32 from the p+ substrate 30 when the device is conducting. It also reduces the electric field of the anode pn junction when the power device 10 is reverse biased. A bottom anode electrode 36 contacts the substrate 30, and a cathode electrode 20 contacts the n+ source region 18. The p-well 14 surrounds the gate structure, and the n− epi layer 32 extends to the surface around the p-well 14.

When the anode electrode 36 is forward biased with respect to the cathode electrode 20, but without a sufficiently positive gate bias, there is no current flow, since the product of the betas (gains) of the pnp and npn transistors is less than one (i.e., there is no regeneration activity).

When the gate is forward biased, electrons from the n+ source region 18 become the majority carriers along the gate sidewalls and below the bottom of the trenches in an inversion layer, causing the effective width of the npn base (the portion of the p-well 14 vertically between the n-layers) to be reduced. As a result, the beta of the npn transistor increases to cause the product of the betas to exceed one. This results in "breakover," when holes are injected into the lightly doped n− epi layer 32 and electrons are injected into the p-well 14 to fully turn on the device. Accordingly, the gate bias initiates the turn-on, and the full turn-on (due to regenerative action) occurs when there is current flow through the npn transistor as well as current flow through the pnp transistor.

When the gate bias is removed, such as the gate electrode 25 being shorted to the cathode electrode 20, the device 10 turns off.

The device 10 is similar to many other types of high current/high voltage insulated gate power devices, such as insulated gate bipolar transistors (IGBTs), in that it is cellular and the source regions are adjacent to the top portion of the gate trenches. An IGBT will typically have the trenches extending into the n-epi layer 32, rather terminating in the p-well 14.

FIG. 2 is a top down view of three cells in a device similar to that of FIG. 1, where the opening 16 in the dielectric exposes a p-type region of the p-well 14 or exposes a p+ contact region in the p-well 14. Both will be referred to as p-type contact regions. In both cases, the exposed p-type contact region is directly adjacent to a top n+ source region 18. FIG. 3 is similar to FIG. 2, but all the cells contain an emitter-to-base short. In both figures, trenched gates surround the n+ source region 18.

Applicant has discovered that, due to the p-type contact region in the opening 16 directly abutting the n+ source region 18, the emitter-to-base shorting is relatively strong in that area, and the shorting "strength" greatly decreases only a relatively small distance away from the opening 16, due to the low doping of the p-well 14. This behavior creates very different levels of protection across the device, which is undesirable. If there are many distributed shorts, such as shown in FIG. 3, the overall performance of the device suffers, such as due to the reduced n-type emitter area, and the gate voltage needed to turn on the device may increase.

What is needed is a design for a vertical insulated gate device, such as the device of FIG. 1 or an IGBT, that includes a certain level of emitter-to-base shorting for robustness, yet results in fairly uniform performance across the device cellular area without degrading the overall performance of the device.

SUMMARY

In one embodiment, openings in a dielectric layer allow a top metal electrode to short a top n-type emitter (n+ source region) to a p-type base (p-well) to improve the device's performance in the presence of transients. The p-type base has exposed p-type contact regions that do not abut the n+ source regions. In other words, the p-type contact regions are isolated from the n+ source regions prior to being shorted by the top electrode. The openings that allow the weak short between the emitter and base may be distributed throughout the cellular array for more uniform performance. The various distributed shorts will result in a more uniform shorting "strength" across the cellular array. This maximizes the ruggedness of the device (e.g., its ability to withstand transients without turning on), while the overall performance of the device is relatively uniform across the cellular array. Since the p-type contact regions are in locations where there is no n+ source region (i.e., there is no need to remove n+ source region area), the current density is not significantly reduced.

The n+ source region and gate configurations may have a variety of shapes that allow the shorting performance to be fairly uniformly distributed throughout the cellular array.

As an additional invention, the p-type contact regions can be p+ and deeper than the well region below the n+ source region, and the well region below the trenches can be made deeper and p+ by implantation through the empty trenches.

The deep p+ contact regions decrease the series resistance between the top surface of the p-type contact region and the p-well areas directly below the n+ source regions for a more uniform emitter-to-base short across the cellular array and to reduce the effects of lateral current flow. The deep p+ areas below the trenches provide a uniform implanted p-type charge between the trench bottoms and the p-n junction. Without the extra implant, the p-type charge between the bottom of the trenches and the n-epi layer is highly dependent on the depth of the trenches and the exact depth of the p-n junction. The trench depth and the depth of the p-n junction vary from lot to lot, but the implant used to form the deep p+ areas is highly repeatable. This feature results in more consistent performance of the devices from lot to lot.

The inventions apply to a wide variety of power devices.

The conductivity types may be reversed.

Other embodiments are disclosed.

BRIEF DESCRIPTION OF THE DRAWINGS

FIG. 9 illustrates that the exposed p-type contact regions are small compared to the n+ source region area, maximizing the current density when the device is turned on.

Elements that are the same or equivalent in the various figures may be labeled with the same numeral.

DETAILED DESCRIPTION

Although the techniques of the present invention can be used for various applications, a few examples will be given with reference to the type of device shown in FIG. 1. The invention also applies to IGBTs, where the trenches (and gates) extend below the p-well so there is a conductive inversion path between the top n+ source regions and the n-epi region when the gates are biased on. Silicon is assumed as the semiconductor material, but other semiconductor materials may be used.

Figure 1:
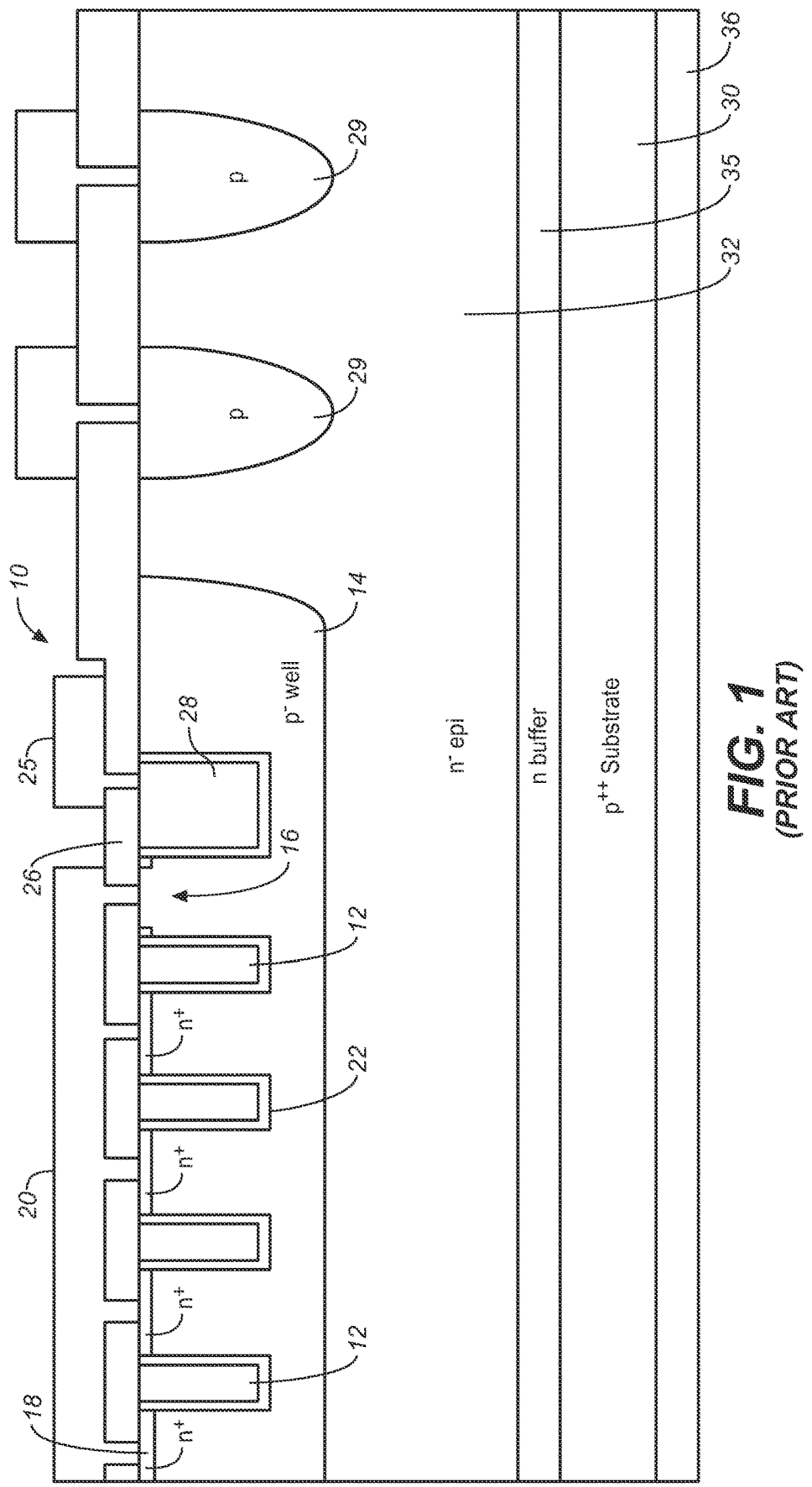
FIG. 1 is copied from Applicant's U.S. Pat. No. 8,878,237 and is a cross-section of a vertical power device having trench gates connected in parallel.
Figure 2:
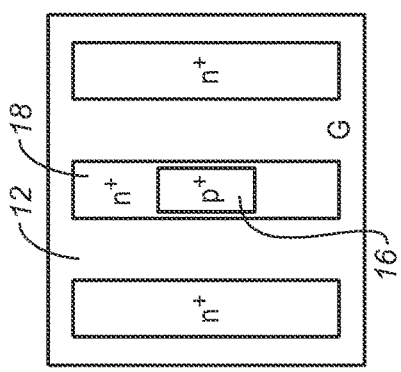
FIG. 2 is also copied from Applicant's U.S. Pat. No. 8,878,237 and shows how the opening in the dielectric (for an emitter-to-base short by the top electrode) results in the exposed p-type contact region abutting the n+ source region, causing the "strength" of the shorting to widely vary across the cellular array.
Figure 3:
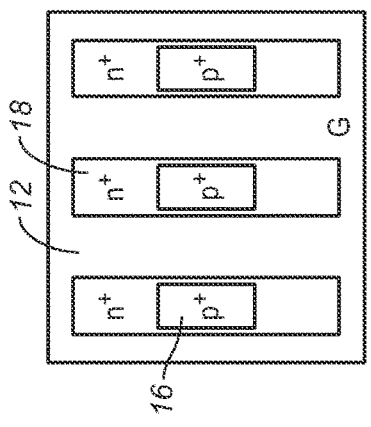
FIG. 3 is similar to FIG. 2 but where all cells have an emitter-to-base short.
Figure 4:
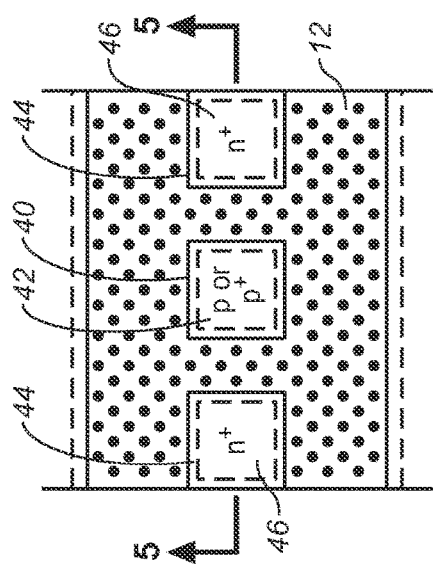
FIG. 4 is a top down view of a small area of a vertical power device, in accordance with one embodiment of the invention, where the openings in the dielectric for distributed emitter-to-base shorts do not result in the p-type contact region abutting an n+ source region.

FIG. 4 is a top down view of a small area of a vertical power device, such as a device similar to FIG. 1 or an IGBT, where the opening 40 in the dielectric 26 (FIG. 1) to expose a p-type contact region 42 (p or p+ type) for the p-well 14 (FIG. 1) and an opening 44 to expose the n+ source region 46, for an emitter-to-base short, does not result in the p-type contact region 42 abutting the n+ source region 46. The p-type contact region 42 may also be referred to as a well contact region. The source region 46 is also considered a source region layer since it is an implanted layer across the device. The openings in the dielectric 26 are made using a patterned etch step.

Figure 5:
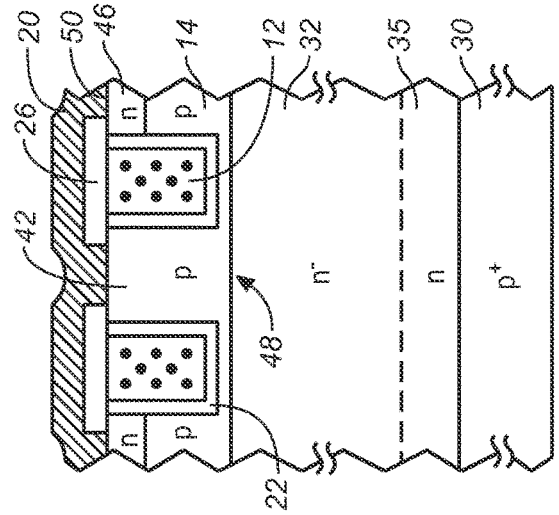
FIG. 5 is taken across line 5-5 in FIG. 4 and shows a cross-section of cells where the middle area has a weak emitter-to-base short, and where the exposed p-type contact region does not abut the n+ source region.

FIG. 5 is taken across line 5-5 in FIG. 4 and shows a cross-section of cells where the dielectric 26 in area 48 (between two closely-spaced gates 12) is opened, and the dielectric 26 in area 50 is opened so that the cathode electrode 20 directly contacts the p-type contact region 42 and the n+ source region 46 to form distributed weak emitter-to-base shorts across the cellular array. Importantly, the exposed p-type contact region 42 does not abut the n+ source region 46 so is electrically isolated prior to the formation of the cathode electrode 20. The two gates 12 sandwiching the p-type contact region 42 are close together, resulting in a fairly insignificant reduction in the n+ source region area. Therefore, current density is not significantly affected by the distributed emitter-to-base shorting.

Figure 6:
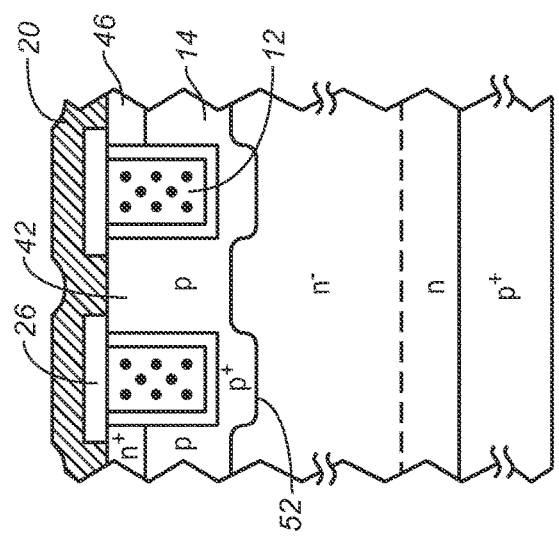
FIG. 6 is also taken across line 5-5 but illustrates a deep p+ area under each gate.

FIG. 6 illustrates a deep p+ area 52 under each gate 12, such as by using ion implantation prior to the trenches being filled with polysilicon. This deep p+ area 52 decreases the series resistance between the top surface of the p-type contact region 42 and the p-well 14 areas directly below the n+ source regions 46, for a more uniform emitter-to-base short across the cellular array and to reduce the effects of lateral current flow.

Figure 7:
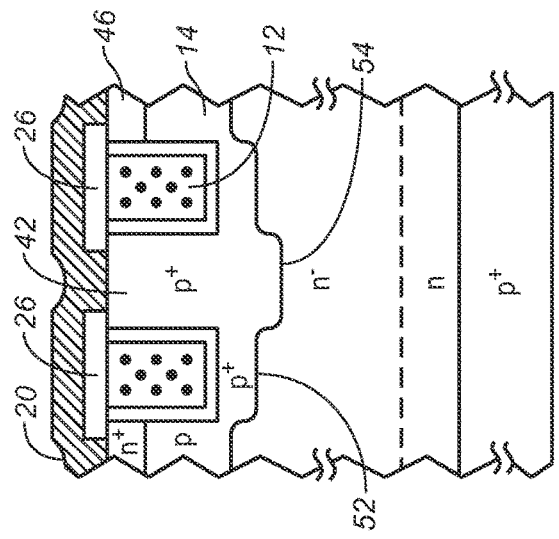
FIG. 7 is also taken across line 5-5 but illustrates a deeper p-type region below the p-type contact region.

FIG. 7 is similar to FIG. 6 but illustrates how the p-type contact regions 42 can be p+, such as by ion implantation through the opening in the dielectric 26. FIG. 7 also illustrates a deeper p+ area 54 below the p-type contact region 42.

The deep p+ areas 52 and 54, in addition to the benefit described with respect to FIG. 6, provide a uniform implanted p-type charge between the trench bottoms and the p-n junction. Without the extra implant, the p-type charge between the bottom of the trenches and the n-epi layer 32 is highly dependent on the depth of the trenches and the exact depth of the p-n junction. The trench depth and the depth of the p-n junction vary from lot to lot, but the implant used to form the deep p+ areas 52 and 54 is highly repeatable. This feature results in more consistent performance of the devices from lot to lot.

The deep p+ areas 52 and 54 also prevent the depletion region (when the device is off) from spreading as great a distance, compared to the distance had the p+ areas 52 and 54 not been present.

In FIGS. 4-7, the p-type contact region 42 is surrounded by the polysilicon gate 12, reducing lateral current effects.

Figure 8:
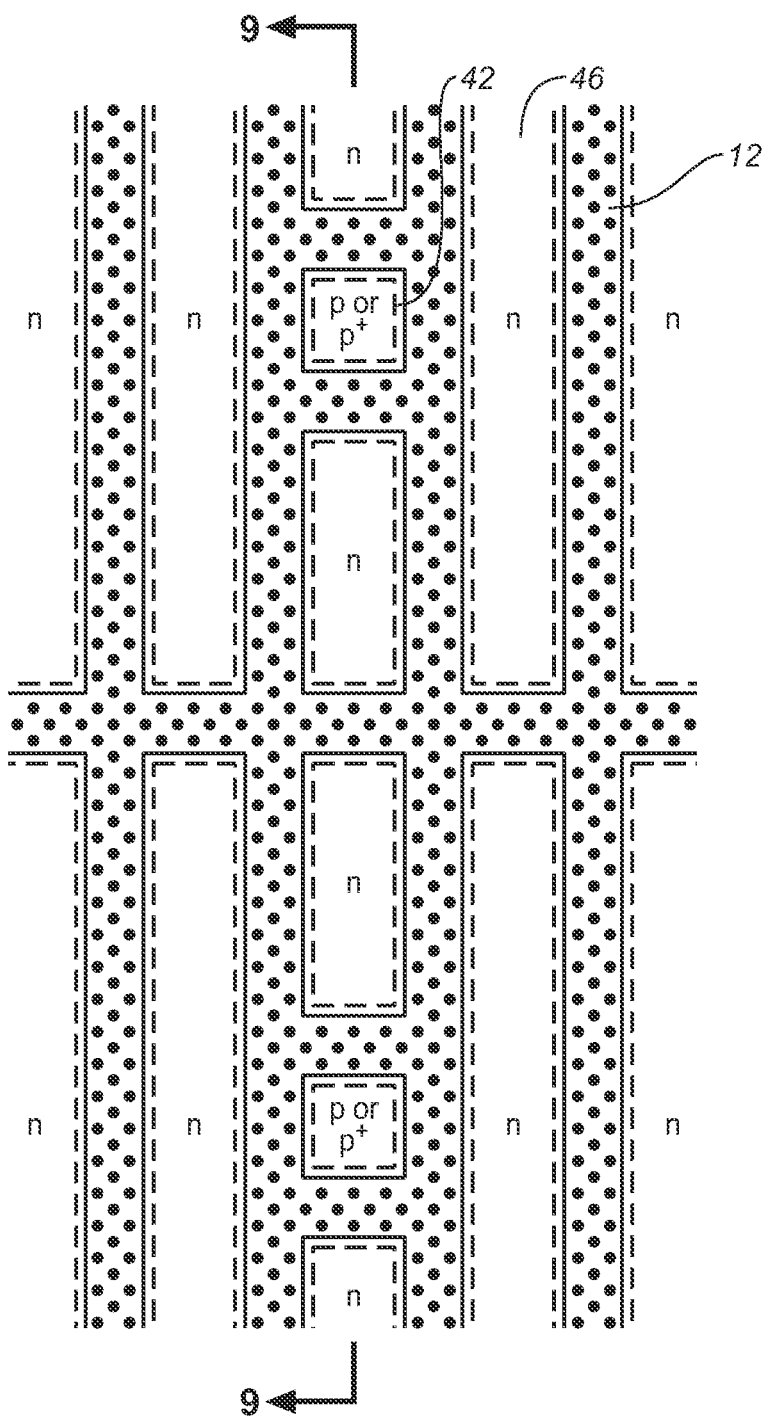
FIG. 8 is a top down view of a small portion of a vertical power device where the n+ source regions (implanted regions) are formed as strips, and the small p-type contact regions (for emitter-to-base shorting) are distributed between the strips.

FIG. 8 is a top down view of a vertical power device where the n+ source regions 46 (implanted regions) are formed as strips, and the small p-type contact regions 42 (for emitter-to-base shorting) are distributed between the strips for a fairly uniform emitter-to-base short across the cellular array. The strips are connected in parallel by the top cathode electrode. The openings in the dielectric, within the dashed outlines in FIG. 8, preferably expose a vast majority of the areas of the n+ source regions 46 for the best device performance.

Figure 9:
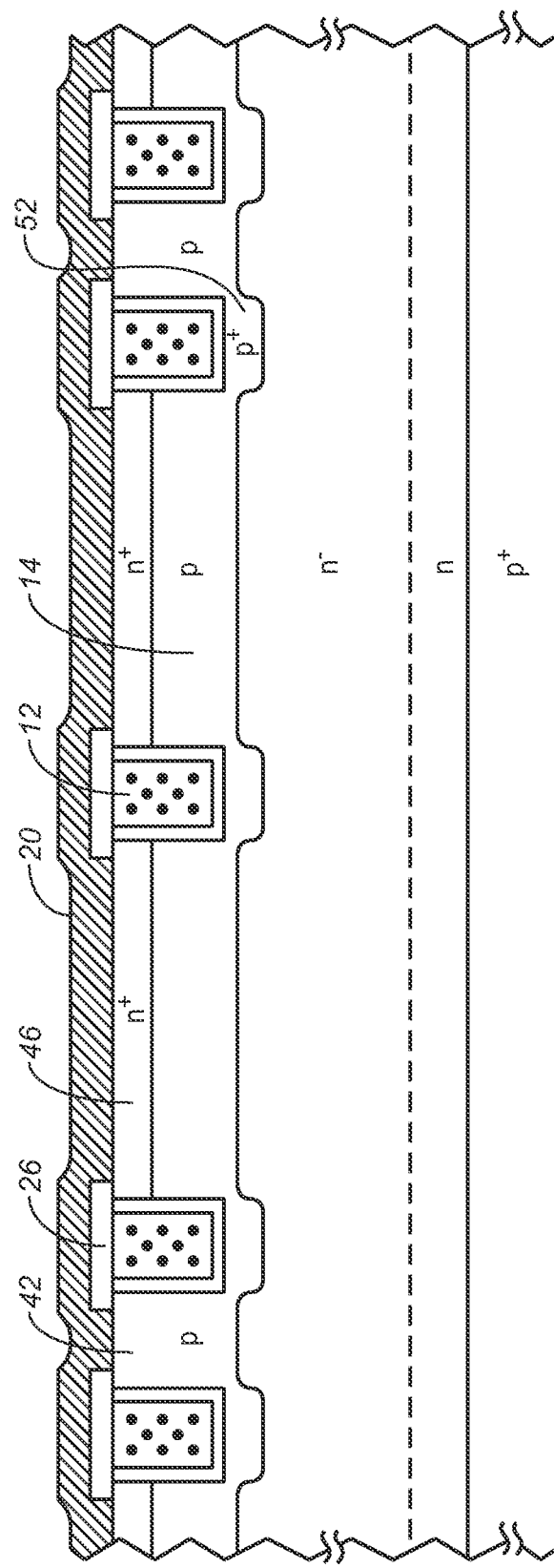

FIG. 9 is taken along line 9-9 in FIG. 8 and shows how the exposed p-type contact regions 42 are very small compared to the exposed n+ source regions 46. This results in very little area of the n+ source being sacrificed for the p-type contact regions 42, maximizing the current density when the device is turned on.

Figure 10:
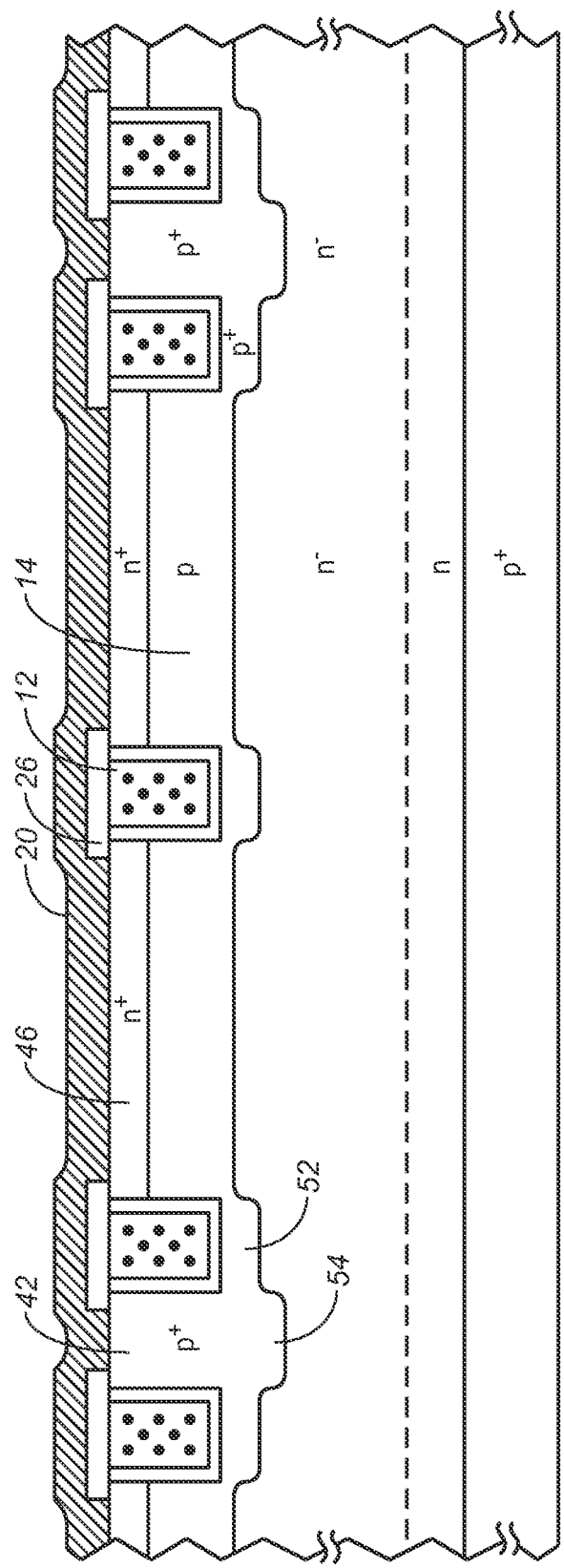
FIG. 10 is similar to FIG. 9 but the p-type contact region is p+ and deeper.

FIG. 10 is similar to FIG. 9 but the p-type contact region 42 is p+ and deeper, as in FIG. 7.

Figure 11:
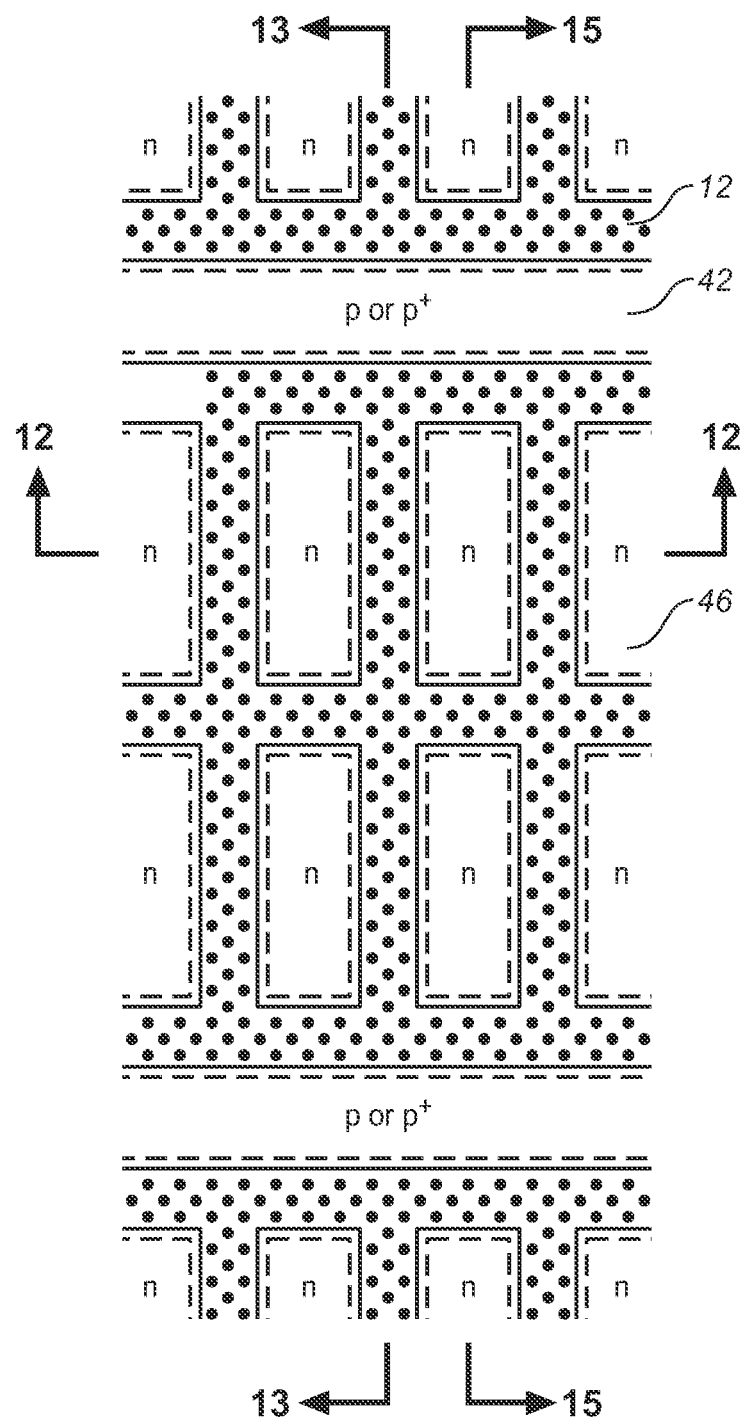
FIG. 11 is a top down view of a small portion of a vertical power device where the p-type contact regions are formed as strips perpendicular to the n+ source region strips for relatively uniform shorting across the cellular array.

FIG. 11 is a top down view of a vertical power device where the p-type contact regions 42 are formed as strips perpendicular to the n+ source region 46 strips for relatively uniform shorting across the cellular array. The p-type contact region strips can be made much narrower than the n+ source region strips.

Figure 12:
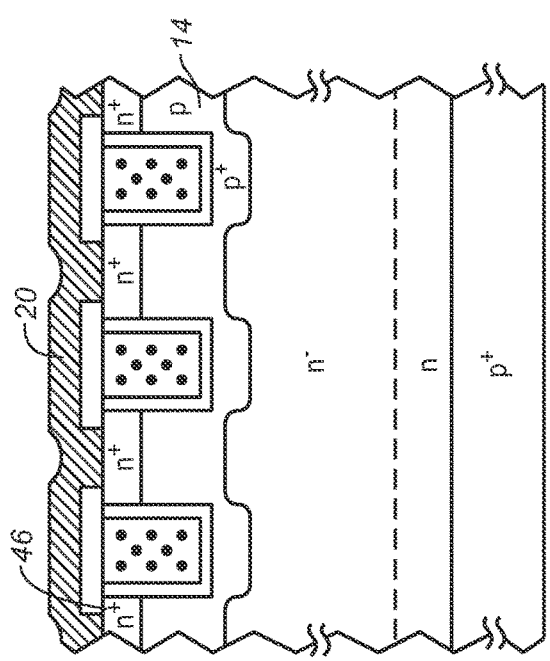
FIG. 12 is taken across line 12-12 in FIG. 11.

FIG. 12 is taken across line 12-12 in FIG. 11, where no p-type contact regions 42 are located.

Figure 13:
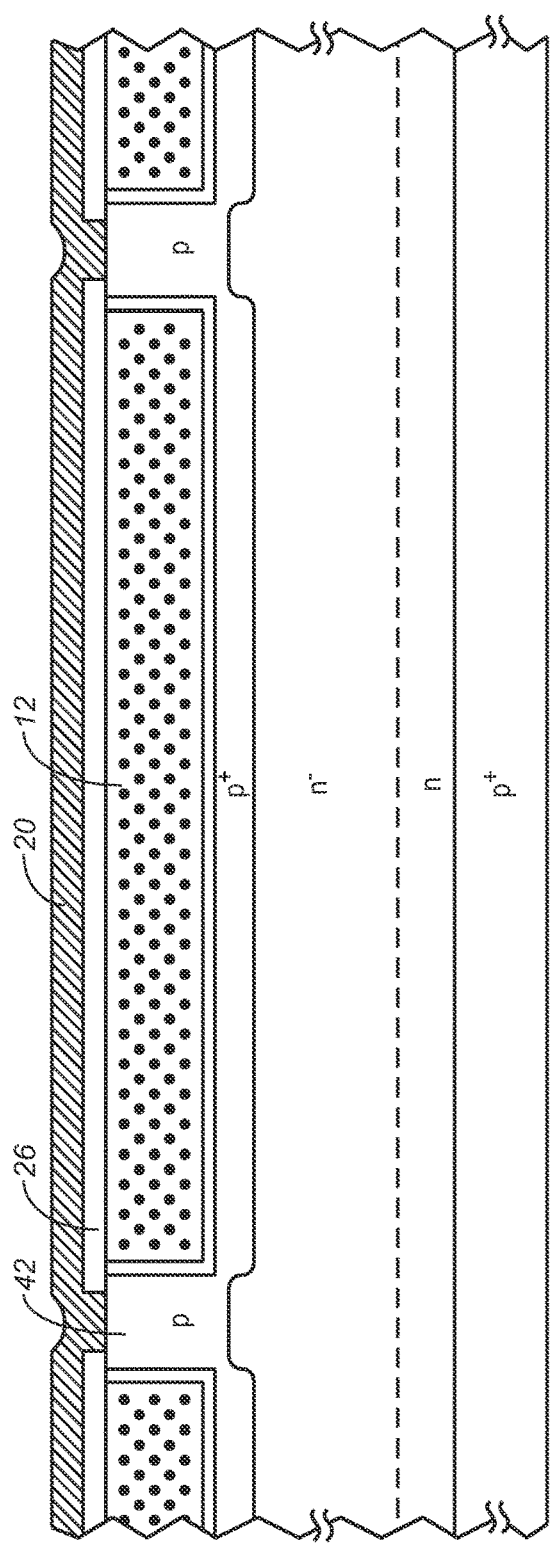
FIG. 13 is taken across line 13-13 in FIG. 11.

FIG. 13 is taken across line 13-13 in FIG. 11, where only the p-type contact regions 42 and gates 12 are located.

Figure 14:
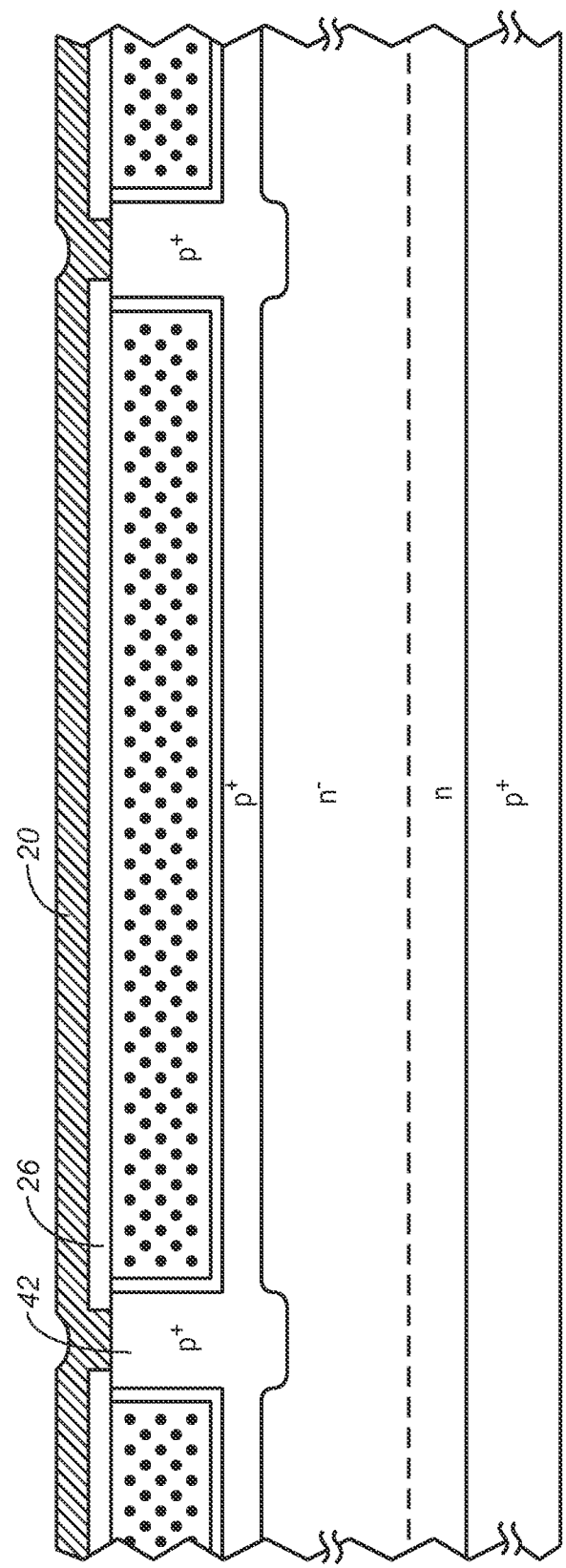
FIG. 14 is also taken across line 13-13 in FIG. 11 but shows deep p+ contact regions.

FIG. 14 is also taken across line 13-13 in FIG. 11 but shows deep p+ contact regions 42.

Figure 15:
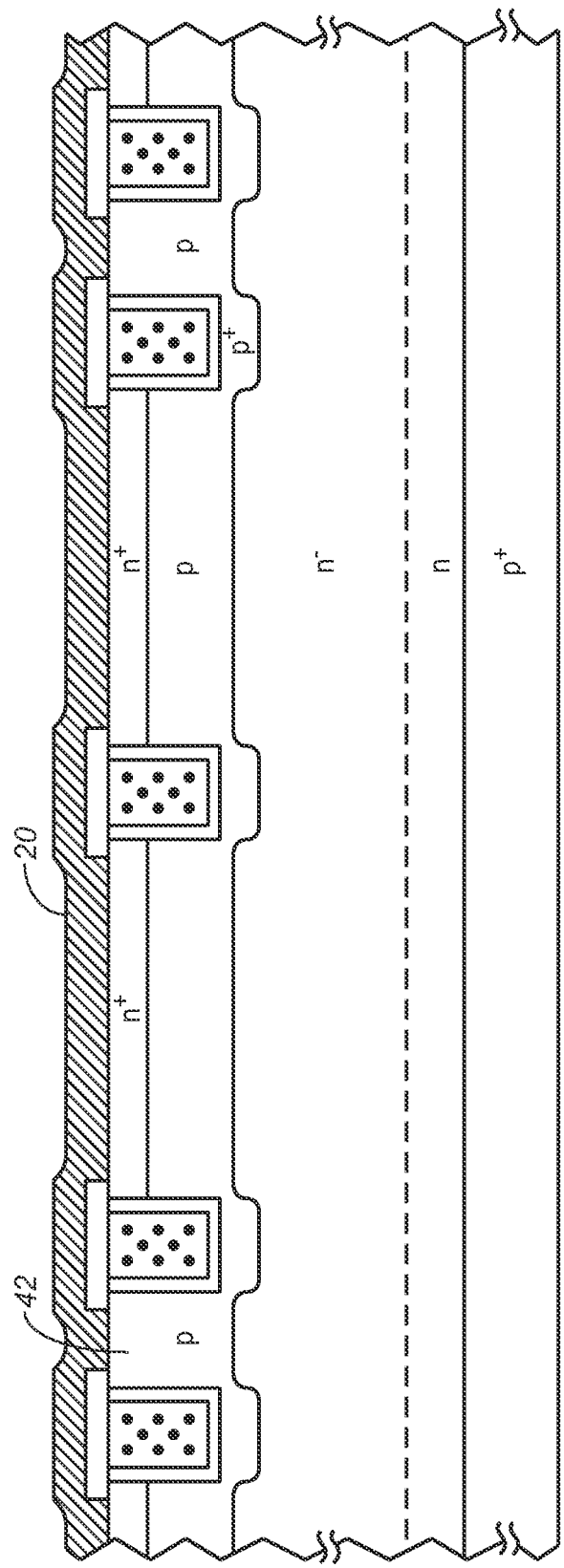
FIG. 15 is taken across line 15-15 in FIG. 11.

FIG. 15 is taken across line 15-15 in FIG. 11, where p-type contact regions 42 and n+ source regions 46 are located.

Figure 16:
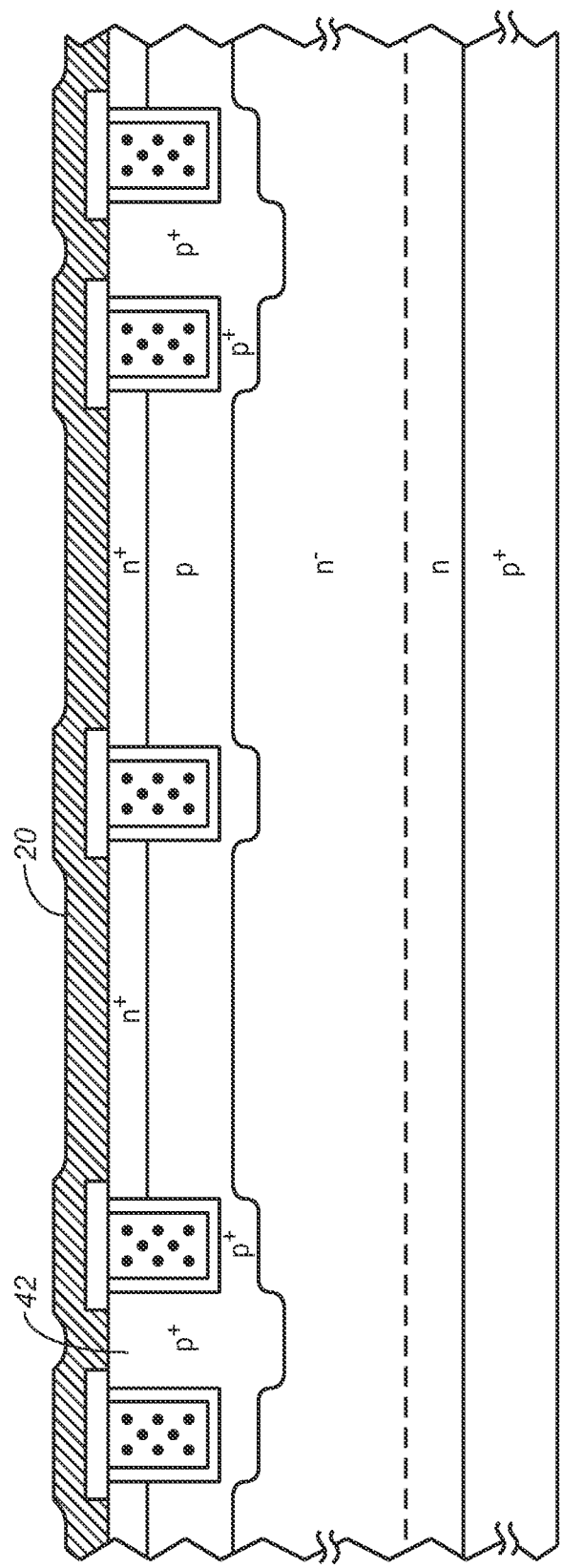
FIG. 16 is also taken across line 15-15 in FIG. 11 but shows deep p+ contact regions.

FIG. 16 is also taken across line 15-15 in FIG. 11 but shows deep p+ contact regions 42.

The various regions may be formed as strips, squares, hexagons, or other shapes. The conductivities of all layers and regions may be reversed.

Various features disclosed may be combined to achieve a desired result.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A vertical power device comprising:
   trenches in a semiconductor material;
   a gate oxide along sidewalls of the trenches;
   a conductor at least partially filling the trenches, to form vertical gates;
   a well layer of a first conductivity type, where the trenches extend at least into the well layer;
   a source region layer of a second conductivity type formed in a top surface of the well layer between some opposing trenches, the source region layer being between the some opposing trenches being source regions of the second conductivity type,
   wherein the source region layer is not formed in first areas of the top surface of the well layer between some other opposing trenches, such that the first areas remain of the first conductivity type;
   a dielectric layer overlying the well layer and the source region layer, the dielectric layer having a plurality of openings that expose portions of the first areas in the top surface of the well layer and the source region layer, the portions of the first areas that are exposed being well contact regions of the first conductivity type; and
   a top electrode overlying the dielectric layer that contacts the well contact regions and the source region layer through the openings,
   wherein the well contact regions do not directly abut the source region layer and any source regions, and
   wherein the top electrode shorts the well layer to the source region layer,
   wherein the well contact regions are more highly doped than the well layer,
   wherein the well layer below the openings is deeper than the well layer below the source region layer, and
   wherein the well layer directly below the trenches is more highly doped than the well region below the source region layer and is deeper than the well layer below the source region layer.

2. The device of claim 1 wherein the source region layer is an emitter in a vertical bipolar transistor, and the well layer is a base in the vertical bipolar transistor, wherein the top electrode shorts out the emitter and the base by contacting the well contact regions and the source region layer through the openings.

3. The device of claim 2 wherein the vertical gates form a cellular array of gates, and the openings in the dielectric layer are distributed across the cellular array of gates.

4. The device of claim 1 wherein the well contact regions are more highly doped than the well layer underlying the dielectric layer.

5. The device of claim 1 wherein the well layer comprises a tub.

6. The device of claim 1 wherein the trenches terminate within the well layer.

7. The device of claim 1 further comprising a bottom electrode.

8. The device of claim 1 wherein the device comprises stacked npnp conductivity layers.

9. The device of claim 1 wherein the source layer is formed as strips in the top surface of the well layer, wherein the strips are electrically connected in parallel by the top electrode.

10. The device of claim 9 wherein the openings that expose portions of the well layer are located between the strips.

11. The device of claim 10 wherein the openings that expose portions of the well layer are formed as strips substantially perpendicular to the strips of the source region layer.

12. The device of claim 10 wherein the openings that expose portions of the well layer are smaller than the openings that expose portions of the source region layer.

13. A vertical power device comprising:
trenches in a semiconductor material;
a gate oxide along sidewalls of the trenches;
a conductor at least partially filling the trenches, to form vertical gates;
a well layer of a first conductivity type, where the trenches extend at least into the well layer;
a source region layer of a second conductivity type formed in a top surface of the well layer between some opposing trenches, the source region layer being between the some opposing trenches being source regions of the second conductivity type,
wherein the source region layer is not formed in first areas of the top surface of the well layer between some other opposing trenches, such that the first areas remain of the first conductivity type;
a dielectric layer overlying the well layer and the source region layer, the dielectric layer having a plurality of openings that expose portions of the first areas in the top surface of the well layer and the source region layer, the portions of the first areas that are exposed being well contact regions of the first conductivity type, wherein the well contact regions do not directly abut the source region layer and any source regions; and
a top electrode overlying the dielectric layer that contacts the well contact regions and the source region layer through the openings, wherein the top electrode shorts the well layer to the source region layer,
wherein the well contact regions are more highly doped than the well layer below the source region layer,
wherein the well layer is also deeper below the well contact regions compared to a depth of the well layer below the source region layer, and
wherein the well layer is deeper below the trenches compared to a depth of the well layer below the source region layer.

14. The device of claim 13 wherein the well layer below the trenches is more highly doped than the well layer below the source region layer.

\* \* \* \* \*